(12) United States Patent
Watkins

(10) Patent No.: US 6,417,562 B1
(45) Date of Patent: Jul. 9, 2002

(54) SILICON VERIFICATION WITH EMBEDDED TESTBENCHES

(75) Inventor: Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/400,686

(22) Filed: Sep. 22, 1999

(51) Int. Cl.⁷ ............................................. H01L 21/00
(52) U.S. Cl. ..................................................... 257/690
(58) Field of Search .................. 257/690, 48, 803, 257/673, 700, 778, 781

(56) References Cited

U.S. PATENT DOCUMENTS 5,053,700 A * 10/1991 Parrish .................. 324/158 R
6,229,206 B1 * 5/2001 Schamberger et al. ...... 257/690

* cited by examiner

*Primary Examiner*—Craig Thompson
(74) *Attorney, Agent, or Firm*—Christopher P. Maiorana, P.C.

(57) ABSTRACT

A system for silicon chip evaluation comprising a chip embedded in a wafer and one or more testbench circuits embedded in the wafer, wherein the one or more testbenches provide verification of the chip. One aspect of the present invention concerns a method for silicon chip verification comprising the steps of (A) embedding a chip in a silicon wafer, (B) embedding one or more testbench circuits in the silicon wafer, and (C) communicating between the one or more testbenches and the chip to provide silicon verification of the chip.

19 Claims, 1 Drawing Sheet

SILICON VERIFICATION WITH EMBEDDED TESTBENCHES

FIELD OF THE INVENTION

The present invention relates to silicon verification generally and, more particularly, to embedding testbenches in silicon for verification.

BACKGROUND OF THE INVENTION

Testbenches are typically used in simulation to verify functionality. Evaluation boards are typically used in silicon verification to verify functionality on a volume scale. Simulation testbenches are usually constrained by slow simulation time.

Conventional testbench based verification is constrained to simulations only. No graceful link between simulation testbenches and silicon verification is normally provided with conventional systems. Typically, testbenches are hard-coded at the module level with little link to chip level.

Conventional testbenches have the disadvantages of not providing "at speed" verification. Additionally, simulation testbenches are slow. Debugging is more difficult with simulation testbenches. At times, significant effort is needed to re-create the debug issue in simulation software.

SUMMARY OF THE INVENTION

One aspect of the present invention concerns a system for silicon chip evaluation comprising a chip embedded in a wafer and one or more testbench circuits embedded in the wafer, wherein the one or more testbenches provide verification of the chip. Another aspect of the present invention concerns a method for silicon chip verification comprising the steps of (A) embedding a chip in a silicon wafer, (B) embedding one or more testbench circuits in the silicon wafer, and (C) communicating between the one or more testbenches and the chip to provide silicon verification of the chip.

The objects, features and advantages of the present invention include providing a silicon testbench that may (i) be implemented using design software, (ii) provide "at speed" verification of a design by implementing the testbench at the silicon level, and/or (iii) provide verification at the silicon level.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention presents a methodology to (i) develop a testbench initially in simulation, (ii) run reasonable simulation verification using the testbench, (iii) migrate the testbenches that add value to silicon verification to the silicon itself, and (iv) when silicon is available, complete testbench based verification at the silicon level. The present invention may be easily enabled by using C2RTL tools. A C2RTL tool essentially converts C language constructs to RTL that may be used to implement a design in silicon.

Figure 1:
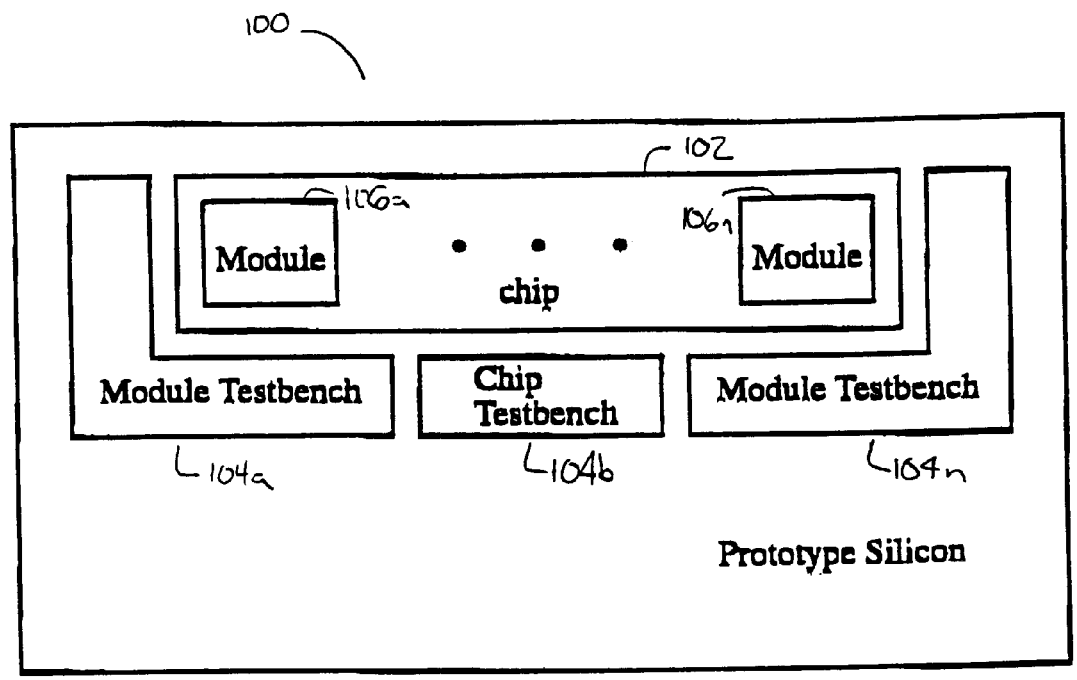
FIG. 1 is a block diagram illustrating a preferred embodiment of the present invention.

Referring to FIG. 1, a circuit 100 is shown implementing a preferred embodiment of the present invention. The circuit 100 generally comprises a chip (or module) 102, and one or more testbenches 104a–104n. The testbenches 104a–104n may be implemented as (i) one or more chip testbenches and/or (ii) one or more module testbenches. The chip 102 may be implemented as one or more modules 106a–106n. The modules 106a–106n may implement a design that requires verification.

Figure 2:
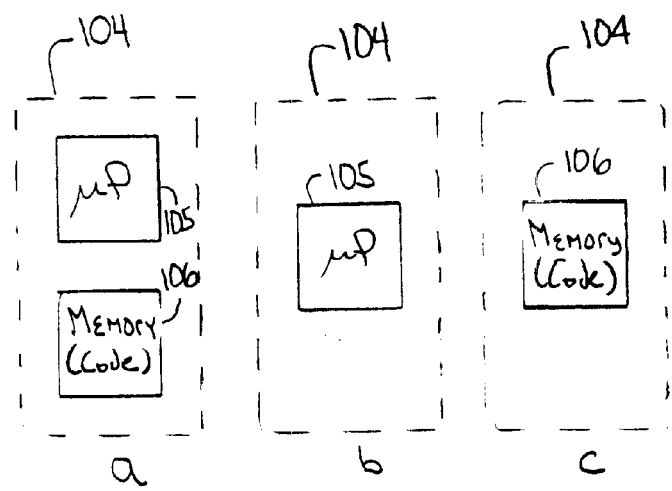
FIGS. 2a–2c illustrate various examples of the testbenches of FIG. 1.

Referring to FIGS. 2a–2c, examples of various implementations of the testbenches 104a–104n are shown. FIG. 2a illustrates a testbench implemented as a microprocessor 105 along with a memory 106. The memory 106 may be configured to store executable instructions in computer code. FIG. 2b illustrates a testbench 104 implemented as a microprocessor 105. FIG. 2c illustrates a testbench 104 implemented as a memory configured to store executable instructions in computer code. The memory 106 may be implemented as a conventional memory such as a random access memory (RAM), a static random access memory (SRAM) or may be implemented as a programmable gate array (PGA), a field programmable gate array (FPGA), etc.

The testbenches 104a–104n may be developed using a software tool, such as System C, prior to implementation in hardware. The modules 106a–106n may be implemented as hardware devices and may optionally be developed using a software tool, such as System C. The testbenches 104a–104n that provide useful/desired testing in software may be migrated to hardware. The circuit 100 may be implemented in silicon with embedded testbenches 104a–104n. The circuit 100 may be (i) a prototype silicon design (e.g., if C2RTL is used, silicon can be 20% larger and size refinement may be appropriate anyway), or (ii) final silicon design.

The present invention may be used in the design and verification of the circuit 100 by (i) implementing one or more module testbenches and one or more chip level simulation testbenches where testing is enabled in silicon, (ii) implementing testbench testing (perhaps initially implemented in a simulation tool) in silicon to verify base functionality, (iii) implementing further testbench testing in silicon (since typical simulation testing is too slow for all desired testing to be achieved), (iv) nets can be probed by via scan or multiplexing nets to chip I/O pins (v) running evaluation system verification, (vi) when issues are encountered, engaging module or chip level testbenches for debug, (vii) after satisfactory verification effort, producing production silicon without the testbenches, and (viii) implementing production silicon in an evaluation system.

The present invention may be used through the entire development of a chip. The present invention may be implemented in a number of software tools such as C2RTL, the Suggestive Partitioning System for System Development concepts or other software appropriate for the design criteria of a particular implementation. Appropriate software may be used to manifest the testbenches in silicon. For example, the present invention may be implemented using a software design tool, such as the verilog hardware description language (HDL) as defined by the IEEE 1364-1995 standard.

Prototype silicon may be developed with the embedded testbenches 104a–104n through a number of iterations to refine the chip implementation. Prototype silicon may be quickly developed from third party software tools software and further verified with the embedded testbenches 104a–104n. An example of appropriate software may be the Interra DProbe parser source, which can be manifested in silicon and used for parsing DVD bitstreams. The Interra DProbe parser source may be used to accelerate the tools or may be included in prototype silicon until the final parser is available. Optionally, the Interra DProbe parser source may provide the final solution in silicon. Another example of appropriate software may be the audio decoder C-model, which can be verified in silicon with a corresponding testbench 104a–104n at a dramatically accelerated rate.

The present invention may enable "at speed" verification with the embedded testbenches. In particular, prototype silicon can be run and tested at the speed of the final production silicon. Verification can be dramatically accelerated with the embedded testbenches 104a–104n, which can improve quality, quantity, time to market, time to volume, and productivity for evaluation system, prototype system, final system, customer's system, and other systems use of the chip implementation.

The embedded testbenches 104a–104n may be included in prototype silicon or production silicon. In production silicon, to save gates, specific testbenches 104a–104n or parts of testbenches 104a–104n may be implemented. If software is used on a processor for test pattern application, test run and test run analysis (and even the testbench), the software does not consume gates and actually can be downloaded and run when this verification is needed.

The embedded testbenches 104a–104n may be implemented that are fully custom to a particular application, or even independent of simulation testbenches. The embedded testbenches 104a–104n may be implemented for a customer's system that may be enabled, such as stressing the customer's host processor interface (which may be different from the evaluation board interface). Low gate count testbenches 104a–104n may be implemented in silicon. Such testbenches 104a–104n may focus on what was not tested in simulation, but what needs to be tested "at speed" to complete testing coverage in a reasonable time.

The embedded testbenches 104a–104n of the present invention may be automatically stripped out for production silicon. With the chip level testbenches 104a–104n of the present invention, a module level testbench may be needed less. Additionally, module and chip level testbenches can be easily linked. The embedded testbenches 104a–104n of the present invention may be implemented to handle gates or code running on a processor (See FIGS. 2a–2c).

When an issue is encountered with silicon using the embedded testbenches 104a–104n of the present invention, replication of the issue in a simulation testbench is typically straight forward. Such replication may be used for leveraging the upload of scan information or testbench parameters.

The embedded testbenches 104a–104n of the present invention may be engaged to assist in issues/debug resolution. The present invention may also be implemented as an embedded testbench 104a–104n with self-test capability embedded in silicon.

Part of the present invention may be implemented to refine the chip implementation with support from the embedded testbenches 104a–104n. A single chip encoder with a corresponding testbenches 104a–104n may be implemented in silicon and enabled to attach seemlessly to, for example, an MPEG2 decoder chip. Such embedded testbenches 104a–104n may be custom built to assess specification requirements compliance and/or video quality assessment.

Testbenches are fundamental to design verification of digital systems. Testbenches typically are mocked up, reduced functional versions of what is in the peripheral portions of the chip when the chip is implemented on an evaluation system, and are used in simulation only. The present invention may liberate the use of testbenches to silicon and may be enabled by, for example, C2RTL and Suggestive Partitioning System concepts. The present invention may enable seemless migration from simulation verification to silicon verification and/or silicon verification to simulation verification. Such migration may leverage silicon at production level speeds, that may dramatically accelerate verification of a design. Such improved verification may save months on a typical large system on a chip development.

While the invention has been particularly shown and described with reference to the preferred embodiments thereof, it will be understood by those skilled in the art that various changes in form and details may be made without departing from the spirit and scope of the invention.

What is claimed is:

1. A system for silicon chip evaluation comprising:
   a chip fabricated in a wafer; and
   one or more testbench circuits fabricated in said wafer, wherein said one or more testbench circuits are configured to provide verification of said chip after said system has been packaged.

2. The system according to claim 1, wherein said one or more testbench circuits are implemented in design software.

3. The system according to claim 1, wherein said system operates at a production level speed of said chip.

4. The system according to claim 1, wherein said one or more testbench circuits comprise one or more chip testing tools.

5. The system according to claim 1, wherein said one or more testbench circuits comprise (i) one or more module testbenches and/or (ii) one or more chip testbenches.

6. The system according to claim 1, wherein said one or more testbench circuits are implemented in a device selected from the group consisting of a microprocessor, a memory, one or more gates, a programmable logic device, a combination of one or more gates and a logic device, and any combination thereof.

7. The system according to claim 1, wherein said system operates such that silicon verification events are replicated in simulation based on efficient transfer of state information.

8. The system according to claim 1, wherein said system is developed using a software development language selected from the group consisting of C, hardware description language (HDL), verilog hardware description language (VHDL), or other appropriate design software.

9. The system according to claim 1, wherein said system comprises the same testbench functionality in silicon as in a simulation.

10. The system according to claim 1, wherein said system comprises a subset of or a superset of a testbench functionality in silicon as in a simulation.

11. The system according to claim 1, wherein said chip is configured to manipulate a digital video bitstream.

12. The system according to claim 11, wherein said testbench circuits are further configured to assess compliance of said digital video bitstream to a specification requirement.

13. The system according to claim 11, wherein said testbench circuits are further configured to assess a video quality of said digital video bitstream.

14. The system according to claim 1, wherein said chip is configured to manipulate audio data.

15. A circuit comprising:
   a module configured to perform a plurality of functions;

a testbench circuit (i) co-fabricated with said module, (ii) physically outside said module and (iii) comprising a microprocessor configured to verify operation of at least a portion of said functions; and a plurality of lines coupling said module to said testbench circuit.

16. The circuit according to claim 15, wherein said testbench circuit further comprises a memory configured to store executable instructions for said microprocessor.

17. The circuit according to claim 16, wherein said testbench circuit further comprises a programmable logic device configured to verify operation of at least a second portion of said function.

18. The circuit according to claim 17, wherein (A) said module further comprises (i) a plurality of nets and (ii) a plurality of I/O pins and (B) said testbench circuit is further configured to route at least one of said nets to at least one of said I/O pins.

19. A system comprising:

means for performing a plurality of functions in silicon;

means for verifying at least a portion of said functions (i) co-fabricated with said means for performing, (ii) physically outside said means for performing and (iii) programmable; and means for coupling said means for performing to said means for verifying.

* * * * *